United States Patent
Steensgaard-Madsen

(10) Patent No.: US 8,390,497 B2
(45) Date of Patent: Mar. 5, 2013

(54) METHOD AND CIRCUIT FOR ENCODING AND TRANSMITTING NUMERICAL VALUES FROM AN ANALOG-TO-DIGITAL CONVERSION PROCESS

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 82 days.

(21) Appl. No.: 13/107,508

(22) Filed: May 13, 2011

(65) Prior Publication Data

US 2011/0285567 A1    Nov. 24, 2011

Related U.S. Application Data

(60) Provisional application No. 61/345,960, filed on May 18, 2010.

(51) Int. Cl.
*H03M 1/12*    (2006.01)
(52) U.S. Cl. ....................................................... 341/155
(58) Field of Classification Search .................. 341/155, 341/161, 162
See application file for complete search history.

(56) References Cited

U.S. PATENT DOCUMENTS

| | | | |
|---|---|---|---|
| 7,408,490 B2 * | 8/2008 | Melanson et al. | 341/120 |
| 7,705,765 B1 | 4/2010 | Yang | |
| 7,782,234 B2 * | 8/2010 | Ahmad | 341/118 |
| 7,924,205 B2 * | 4/2011 | Yoshinaga | 341/161 |
| 2009/0309778 A1 | 12/2009 | Yoshinaga | |
| 2010/0060503 A1 | 3/2010 | Sakakibara | |

OTHER PUBLICATIONS

Extended European Search Report, issued in European Patent Application No. 11 004 111.8, dated Jul. 22, 2011.

* cited by examiner

*Primary Examiner* — Brian Young
(74) *Attorney, Agent, or Firm* — McDermott Will & Emery LLP

(57) ABSTRACT

An analog-to-digital converter system and methodology comprising an analog-to-digital converter circuit configured to provide sequentially a plurality of codes designating a numerical value in a first number system. The analog-to-digital converter system further comprising an encoder interface circuit configured to receive the plurality of codes and to derive a redundant digital representation. A portion of the redundant digital representation is transmitted during the conversion period. The encoder interface circuit may be configured to use a numerical successive-approximation algorithm to derive the redundant digital representation. A substantial portion of the redundant digital representation may be transmitted via a serial interface during the conversion period to reduce an overall latency.

19 Claims, 5 Drawing Sheets

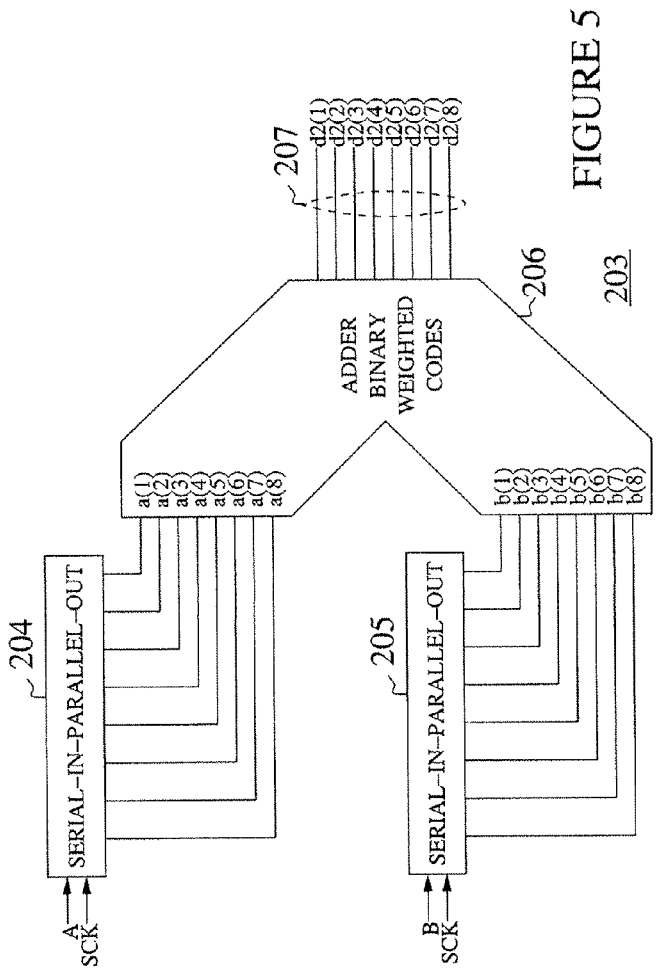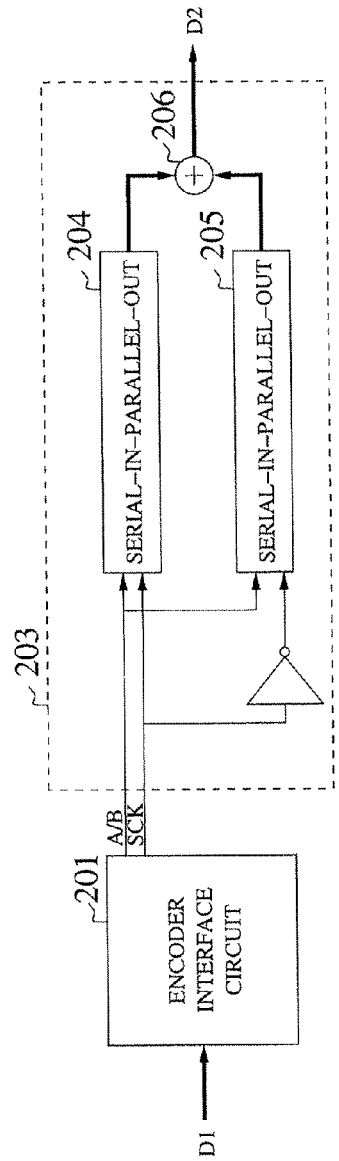

Residue Range, step n

| | RL(n) | RU(n) |
|---|---|---|
| n=1 | −0.04407 | 0.63976 |
| n=2 | −0.02329 | 0.33590 |
| n=3 | −0.01225 | 0.17561 |
| n=4 | −0.00638 | 0.09160 |
| n=5 | −0.00326 | 0.04720 |
| n=6 | −0.00165 | 0.02373 |
| n=7 | −0.00080 | 0.01164 |
| n=8 | −0.00036 | 0.00520 |
| n=9 | −0.00012 | 0.00180 |
| n=10 | 0 | 0 |

FIGURE 7b

Numerical Weights W(x,n)

| | x(n)=0 | x(n)=1 |
|---|---|---|
| W(x,1) | −0.04006 | 0.58000 |
| W(x,2) | −0.02078 | 0.30386 |
| W(x,3) | −0.01104 | 0.16029 |
| W(x,4) | −0.00587 | 0.08401 |
| W(x,5) | −0.00312 | 0.04440 |
| W(x,6) | −0.00161 | 0.02347 |
| W(x,7) | −0.00085 | 0.01209 |
| W(x,8) | −0.00044 | 0.00644 |
| W(x,9) | −0.00024 | 0.00340 |
| W(x,10) | −0.00012 | 0.00180 |

FIGURE 7a

```
function [Acode Bcode] = encoderinterfacecircuit(x)

% numerical data
W0 = [-4006 -2078 -1104  -587 -312 -161  -85 -44 -24 -12]./100000;
W1 = [58000 30386 16029  8401 4440 2347 1209 644 340 180]./100000;
RL = [-4407 -2329 -1225  -638 -326 -165  -80 -36 -12   0]./100000;

% set initial conditions
Acode = [];
Bcode = [];
D1val = 0;
D3val = 0;

% encode during 10-step A/D conversion cycle
for n=1:10
    switch x(n)
        case 0, D1val = D1val + W0(n);
        case 1, D1val = D1val + W1(n);
    end
    if n>=3
        bitwgt=1/2^(n-2);
        Q=(D1val+RL(n)-D3val)/bitwgt;
        if D3val+floor(Q)*bitwgt>=1, Q=(1-D3val-bitwgt)/bitwgt; end
        switch floor(Q)
            case 2,     Acode(n-2)=1; Bcode(n-2)=1; D3val=D3val+2*bitwgt;
            case 1,     Acode(n-2)=1; Bcode(n-2)=0; D3val=D3val+1*bitwgt;
            otherwise,  Acode(n-2)=0; Bcode(n-2)=0; D3val=D3val+0*bitwgt;
        end
    end
end
```

FIGURE 8

METHOD AND CIRCUIT FOR ENCODING AND TRANSMITTING NUMERICAL VALUES FROM AN ANALOG-TO-DIGITAL CONVERSION PROCESS

RELATED APPLICATION

This application claims priority of provisional patent application No. 61/345,960, filed May 18, 2010, the content of which is incorporated herein in its entirety.

TECHNICAL FIELD

The present teaching relates to electrical circuits. Particularly, the present teaching relates to analog-to-digital converters.

DISCUSSION OF TECHNICAL BACKGROUND

Analog-to-digital converters (ADCs) are used for a wide range of applications, including, but not limited to, sensor interfaces, industrial applications, consumer applications, and communications. Various circuits and techniques have been developed for analog-to-digital (A/D) conversion targeting various applications and their varying requirements in terms of speed, resolution, noise, power consumption, and other performance related parameters.

Throughput is a speed-related parameter for an ADC characterizing the number of A/D conversion operations that the ADC can perform per second. Throughput may be expressed in a physical unit such as SPS (samples per second). Latency is another speed-related parameter characterizing the amount of time it takes from when an A/D conversion operation is initiated to when a corresponding digital representation (result) is available. Latency may be a more important speed-related parameter than throughput is for some applications. A digital representation provided by an ADC is received by a receiving digital circuit (DSP, FPGA, CPLD, etc.) and an effective latency of an ADC system includes the time it takes to communicate a digital representation to a receiving digital circuit.

FIG. 1 shows a prior-art configuration wherein an ADC system 100 samples an analog input signal AIN in response to a transition of a conversion-start CNVST signal and provides a compact digital representation D2 of a numerical value to a receiving digital circuit 103. The compact digital representation D2 may be a binary-weighted code designating a numerical value as a scaled sum of power-of-two weighting coefficients. Number systems (coding schemes defining a set of codes and designating a numerical value for each code) using straight binary-weighted codes as well as two's-complement binary-weighted codes are well known to those skilled in the art. A compact digital representation is a representation of numerical values using a number system for which distinct digital codes represent distinct numerical values. For example, a 2-bit coding scheme using 4 distinct codes ('00' '01' '10' and '11') is a compact digital representation if the 4 distinct codes are defined to designate 4 distinct numerical values (e.g., 0, 1, 2, and 3) or (e.g., −2, −1, 0, and 1) or (e.g., −6, 3, 32.5, and 128). A redundant digital representation is a representation of numerical values using a number system for which several distinct codes designate the same numerical value. For example, a 2-bit coding scheme using 4 distinct codes ('00' '01' 10' and '11') is a redundant digital representation if the 4 distinct codes are defined to designate 3 distinct numerical values (e.g., −1, 0, 0, and 1).

ADC system 100 may comprise an ADC circuit 101 providing a first digital representation D1 of a numerical value to an interface circuit 102. Interface circuit 102 may perform computations to derive compact digital representation D2 transferred to receiving digital circuit 103. Interface circuit 102 may cause substantial latency, especially if a transmission period wherein D2 is physically transferred is of considerable duration and if the transmission period does not begin until after an A/D conversion process implemented by ADC circuit 101 is complete. Receiving digital circuit 103 may share a semiconductor substrate with ADC system 100, or circuits 100, 103 may be implemented on separate dies and may be enclosed in separate packages.

ADC circuit 101 may implement a sequential A/D conversion process and may be referred to as a sequential ADC. Examples of sequential ADCs include, but are not limited to, successive-approximation ADCs (SAR ADCs), cyclic ADCs, pipelined ADCs, two-step (multi-step) ADCs, sub-ranging ADCs, delta-sigma ADCs, incremental ADCs, dual-slope ADCs, etc. Common for sequential ADCs is that a digital representation of a numerical value is derived during a sequence of steps of a sequential A/D conversion process.

FIG. 2 shows an exemplary sequential ADC circuit, which may be referred to as a successive-approximation ADC 101. Analog input AIN is sampled by a sample-and-hold circuit 104 providing a sampled analog input voltage AIN(k) that is substantially constant for a duration of a sequential A/D conversion process cycle. An A/D conversion control circuit ADCCC 105 (sometimes called a SAR) may be a digital state machine that is reset/initiated by the CNVST signal. In a first step (n=1) of the conversion process, ADCCC 105 may provide a predefined numerical value d(1) to a digital-to-analog converter (DAC) circuit 106. For a full-scale input range of AIN(k) spanning from 0V to a reference voltage VREF, the predefined numerical value d(1) may be ½ and a corresponding first residue voltage $R(k,1)=AIN(k)-VREF/2$ is provided to a quantizer circuit 107. Quantizer circuit 107 evaluates the first residue voltage $R(k,1)$ and provides a first code $x(1)$ to ADCCC 105. Digital codes $x(n)$ provided by quantizer circuit 107 may be single-bit polarity indications of residue voltages $R(k,n)$. However, for some implementations of successive-approximation ADC 101, quantizer circuit 107 may provide multi-bit codes $x(n)$. Analog input voltage $AIN(k)$ may be any voltage in the full-scale input range, which may be described herein by defining an initial uncertainty range as $0V \leq AIN(k) \leq VREF$. If a first code $x(1)$ provided by quantizer circuit 107 indicates that a polarity of $R(k,1)=AIN(k)-VREF/2$ is positive it may be concluded that $AIN(k) \geq VREF/2$, which may be described herein by defining a first uncertainty range as $VREF/2 \leq AIN(k) \leq VREF$. If alternately the first code $x(1)$ provided by quantizer circuit 107 indicates that the polarity of $R(k,1)$ is negative it may be concluded that $AIN(k) \leq VREF/2$, which may be described herein by defining the first uncertainty range as $0V \leq AIN(k) \leq VREF/2$. If quantizer circuit 107 provides multi-bit codes $x(n)$ indicating more than just a polarity of residue voltages $R(k,n)$ a less-wide (narrower) first uncertainty range may be defined, such as for example $VREF/8 \leq AIN(k) \leq VREF/4$. In a second step (n=2) of the A/D conversion process, ADCCC 105 provides a second numerical value d(2) to DAC 106 based on the first code $x(1)$ and first uncertainty range. For example, the second value d(2) may be selected such that DAC 106 outputs a voltage $VREF*d(2)$ substantially centered in the first uncertainty range. Quantizer circuit 107 evaluates a second residue voltage $R(k,2)=AIN(k)-VREF*d(2)$ and provides a second code $x(2)$ to ADCCC 105. A second uncertainty range is defined based on the first uncertainty range and the second code $x(2)$. For example, if the first uncertainty range is defined as $0V \leq AIN(k) \leq VREF/2$ and x(2) indicates that a polarity of R(k,2) is positive for $R(k,2)=AIN(k)-VREF/4$ a second uncertainty range may be defined as $VREF/4 \leq AIN(k) \leq VREF/2$. In each step of the A/D conversion process, an uncertainty range is defined that is enclosed by an uncertainty range defined in the previous step of the conversion process. Accordingly, a sequential successive-approximation algorithm may define a sequence of progressively more and more restrictive (narrow) uncertainty ranges, whereby a digital representation of a numerical value representing AIN(k)/REF may be obtained in a number N of steps.

SAR ADC 101 may incorporate a single-bit quantizer circuit 107 and reduce a width of an uncertainty range by a factor of two in each step of a conversion process. For such a SAR ADC, a sequence of single-bit codes x(1), x(2), x(3), ... x(N) may be construed as a composite code for a binary-weighted digital representation D1 of AIN(k). For example, if x(1)=1, x(2)=0, x(3)=0, and x(4)=1, then D1=' 1001b' may be a binary-weighted representation of a numerical value $x(1)/2+x(2)/4+x(3)/8+x(4)/16=9/16$ reflecting that SAR ADC 101 has defined a $N=4^{th}$ uncertainty range as $9/16*VREF \leq AIN(k) \leq 10/16*VREF$. In this example, the nth bit x(n) of a compact binary-weighted digital representation D2=D1 is known with certainty after the nth step of the conversion process. Interface circuit 102 in FIG. 1 may transmit each bit of D2=D1 serially to receiving circuit 103 at substantially the same time as individual bits x(n) are being determined by SAR ADC circuit 101. In such a configuration, interface circuit 102 may perform no numerical computations and interface circuit 102 may not contribute substantially to a latency of ADC system 100.

Sequential ADCs may be configured to operate with a digital overlap algorithm and/or a digital correction algorithm. It is well known that such algorithms may be used to make an A/D conversion process less sensitive to imperfections of analog circuitry, including but not limited to incomplete settling of R(k,n), noise of quantizer circuit 107, and mismatch of coefficients for DAC circuit 106 (e.g., mismatch of capacitor ratios). Several publications describe use of such algorithms, including but not limited to, paper 10.6 at 2002 IEEE International Solid-State Circuits Conference by Franz Kuttner; paper 13.6 at 2007 IEEE International Solid-State Circuits Conference by Hesener et al; paper 12.1 at 2008 IEEE International Solid-State Circuits Conference by Giannini et al; and U.S. Pat. No. 7,705,765 to Heemin Yang. Kuttner describes use of a digital overlap algorithm and illustrates an exemplary sequence of overlapping uncertainty ranges on page 136 of the 2002 International Solid-State Circuits Conference visual supplement.

A sequential ADC configured to operate with a digital overlap algorithm and/or a digital correction algorithm may provide a first digital representation D1 of a numerical value that requires some computations to be performed by interface circuit 102 to derive a compact digital representation D2. This aspect is described and illustrated by Yang in FIG. 7 of U.S. Pat. No. 7,705,765. Accordingly, individual bits of a compact digital representation D2 transmitted by ADC system 100 to receiving digital circuit 103 (FIG. 1) may not be known with certainty until after ADC circuit 101 has completed the A/D conversion process. ADC system 100 may transmit D2 in a serial format (even if receiving digital circuit 103 is implemented on a shared semiconductor substrate) and a transmission period of a finite duration may contribute substantially to an overall latency parameter.

What is needed is a method and circuit for encoding and transmitting numerical values from an analog-to-digital conversion process that is advantageous in terms of latency.

SUMMARY

An embodiment of an analog-to-digital converter system is described wherein an analog-to-digital converter circuit is configured to provide sequentially a plurality of codes during a conversion period. An encoder interface circuit is configured to receive the plurality of codes and to derive a redundant digital representation. A portion of the redundant digital representation is transmitted during the conversion period.

Another embodiment describes an analog-to-digital converter system comprising an encoder interface circuit configured to use a numerical successive-approximation algorithm to derive a redundant digital representation.

Another embodiment describes a method for encoding and transmitting a first numerical value obtained from a sequential analog-to-digital conversion process. A step of the method is to receive a first set of codes defined for a first number system to confine the first numerical value in a first numerical uncertainty range. Another step of the method is to provide a second number system, different from the first number system, and to assign a digital state to a portion of a code defined for the second number system to define a second numerical uncertainty range enclosing the first numerical uncertainty range. Another step of the method is to transmit the assigned digital state of the portion of the code defined for the second number system before the analog-to-digital conversion process completes.

Other embodiments involving methods and circuits for encoding and transmitting numerical values from an analog-to-digital conversion process according to the present teaching are described.

BRIEF DESCRIPTION OF THE DRAWINGS

The present teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 5 shows a decoder interface circuit for embodiments of the present teaching;

FIG. 6 shows decoder interface circuit for another embodiment of the present teaching;

FIGS. 7a and 7b show numerical values pertaining to an embodiment of the present teaching;

FIG. 8 shows a software description of a digital state machine incorporated in an encoder interface circuit in an embodiment of the present teaching.

DETAILED DESCRIPTION

The present teaching discloses an encoder interface circuit and a decoder interface circuit and methods to transfer a digital representation of a numerical value obtained from an A/D conversion process to reduce an overall latency of an ADC system.

Figure 1:
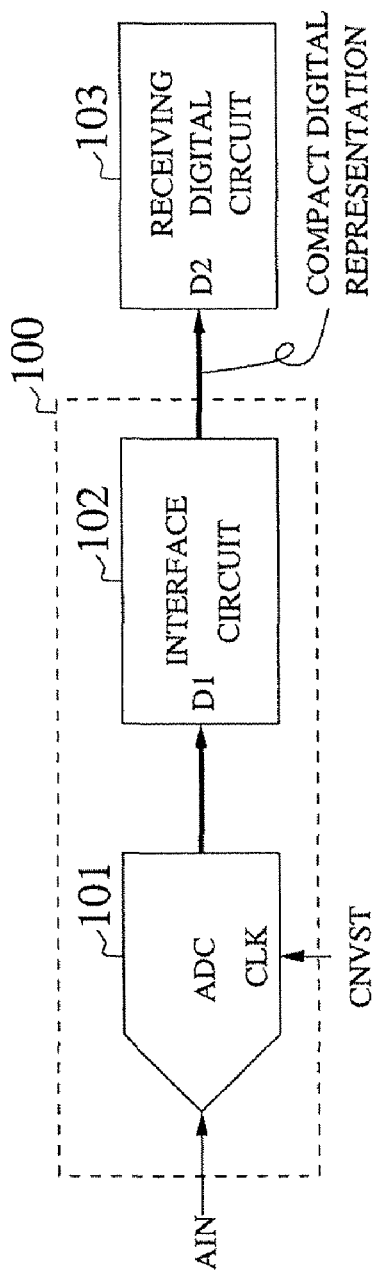
FIG. 1 (Prior Art) illustrates an ADC system providing a compact digital representation D2 of an analog signal quantity AIN to a receiving digital circuit.
Figure 2:
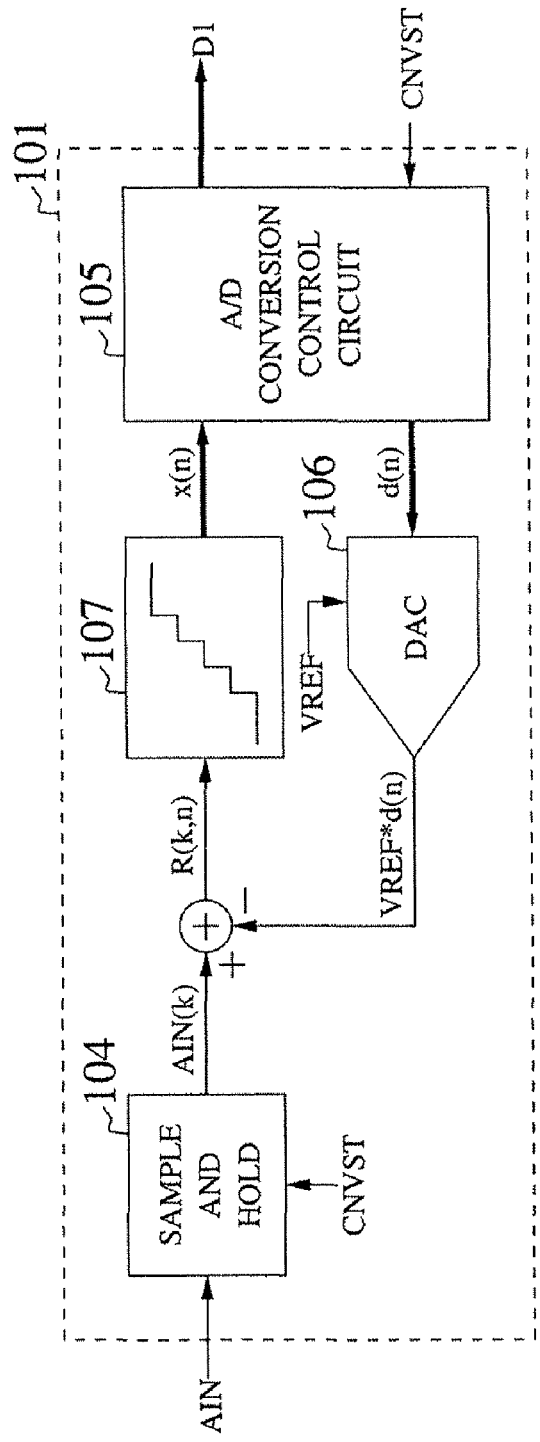
FIG. 2 (Prior Art) illustrates an exemplary successive-approximation ADC circuit incorporated in FIG. 1.
Figure 3:
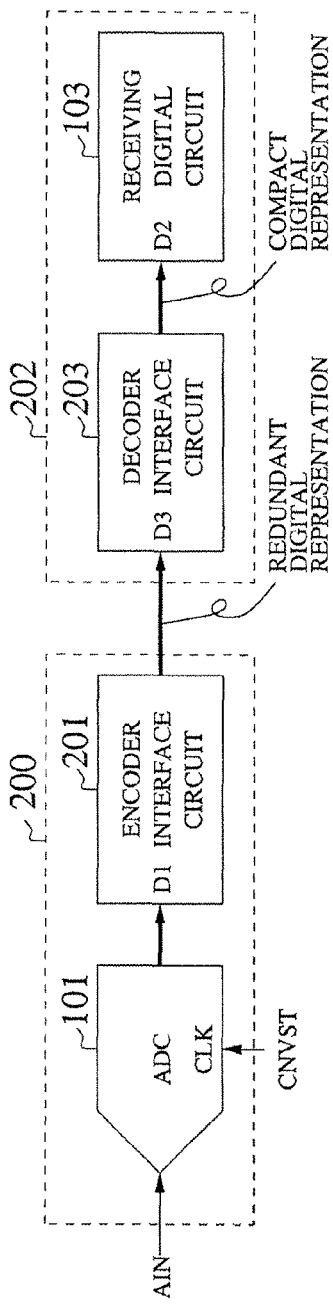
FIG. 3 shows a block diagram including interface circuitry configured according to the present teaching.

FIG. 3 shows a block diagram including interface circuitry configured according to the present teaching. ADC system 200 comprises a sequential ADC circuit 101 similar or identical to ADC circuit 101 of FIGS. 1 and 2. An encoder interface circuit 201 receives a first digital representation D1 from ADC circuit 101 and provides a redundant digital representation D3 to a receiving digital system 202. Receiving digital system 202 comprises a decoder interface circuit 203 and a receiving digital circuit 103. Receiving digital circuit 103 may be similar or identical to receiving digital circuit 103 of FIG. 1. Decoder interface circuit 203 receives redundant digital representation D3 and provides a compact digital representation D2 to receiving digital circuit 103. Accordingly, interface circuit 102 of prior-art configuration FIG. 1 may be replaced by encoder interface circuit 201 and decoder interface circuit 203 of the present teaching as shown in FIG. 3. The first digital representation D1 and the compact digital representation D2 may be the same in FIGS. 1 and 3.

ADC circuit 101 may be configured to operate with a digital overlap algorithm and/or a digital correction algorithm. Computations may be required to derive compact digital representation D2 from the first digital representation D1. Some of the required computations may be specific to an architecture of ADC circuit 101 (e.g. allocation of overlap ranges) and some may involve digital correction information that may be specific to a particular instance (chip) of ADC circuit 101. Digital correction information may be provided by circuitry (e.g. memory) implemented in close proximity to ADC circuit 101, and it may be preferable to perform most or all computations that are specific to ADC circuit 101 within the encoder interface circuit 201. Receiving digital system 202 may be implemented as a separate circuit in a separate package and may be located on a separate printed circuit board. Accordingly, it may be preferable that decoder interface circuit 203 be configured to perform generic computations that may be performed by generic circuitry available on most digital signal processing platforms. For example, decoder interface circuit 203 may be configured to receive and add two binary-weighted codes designating two numerical values, A and B, to derive a compact binary-weighted digital representation D2=A+B.

Figure 4:
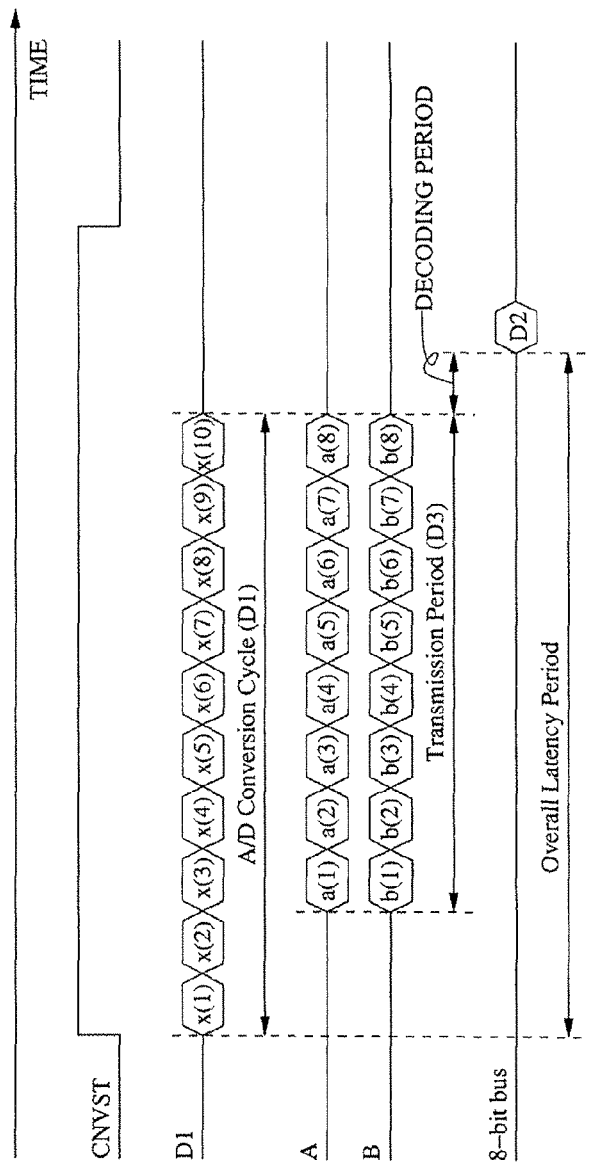
FIG. 4 shows a timing diagram for embodiments of the present teaching.

FIG. 4 shows a timing diagram for an exemplary first embodiment implemented according to the block diagram of FIG. 3. A 10-step A/D conversion process cycle is initiated by a rising edge of CNVST. The A/D conversion process operates according to a digital overlap algorithm. Each step of the A/D conversion process provides one bit x(n) of a composite code of first digital representation D1, for which a numerical value is defined as x(1)/2+x(2)/4+x(3)/8+x(4)/16+x(5)/16+x(6)/32+x(7)/64+x(8)/128+x(9)/256+x(10)/256. A compact digital representation D2 of D1 is encoded using 8-bit straight binary-weighted codes. D2 is available to receiving digital circuit 103 via an 8-bit parallel bus after an overall latency period. Encoder interface circuit 201 receives the first digital representation D1 during the A/D conversion cycle and provides a redundant digital representation D3 encoded as two 8-bit straight binary-weighted codes, A and B. Accordingly, A and B are interchangeable 8-bit segments of 16-bit composite codes of redundant digital representation D3. A and B are communicated separately to receiving digital system 202 via two lanes of serial communication (starting with most significant bits, a(1) and b(1)). A transmission period for serial communication of D3 starts during the A/D conversion cycle and ends at or shortly after the last step of the conversion cycle. Decoder interface circuit 203 combines 8-bit binary-weighted codes A and B using addition during a short decoding period after the transmission period. A resulting compact 8-bit binary-weighted representation D2=A+B is provided to receiving digital circuit 103. Accordingly, an overall latency parameter of the first embodiment may be only slightly greater than a duration of the A/D conversion cycle.

The number system designating values of 10-bit codes x(n) representing D1 in the first embodiment confines D1 to designate a value in a range from 0 to 17/16 in steps (increments) of 1/256. The compact digital representation D2 may designate any value in a range from 0 to 255/256 in steps of 1/256. Interface circuits 201,203 perform a limiting operation such that any value of D1 exceeding 255/256 results in D2=255/256. The first embodiment implements the limiting operation in encoder interface circuit 201. In another embodiment, the limiting operation may be implemented in decoder interface circuit 203.

Encoder interface circuit 201 of the first embodiment implements a first algorithm described in this paragraph. Bits a(1), a(2), and a(3) assume the digital states of x(1), x(2), and x(3). Bits b(1), b(2), and b(3) are always 0. Bit a(4) is an OR function of x(4) and x(5). Bit b(4) is an AND function of x(4) and x(5) unless x(1)–x(2)–x(3)–x(4)–x(5)-1, in which case a(5)=a(6)=a(7)=a(8)–1 and b(4)–b(5)=b(6)=b(7)=b(8)=0. If any of x(1), x(2), x(3), x(4), x(5) is 0, then a(5), a(6), a(7), and a(8) assume the digital states of x(6), x(7), x(8) and x(9). Finally, b(8)=x(10) unless a(1)=a(2)=a(3)=a(4)=a(5)=a(6)=a(7)=a(8)-1, in which case b(8)=0. Encoder interface circuit 201 may be implemented as a digital state machine that is clocked in response to ADC circuit 101 providing a code x(n). It is well within the skills of someone ordinarily skilled in the art to realize a digital state machine implementing the described first algorithm.

Decoder interface circuit 203 of the first embodiment may be implemented as shown in FIG. 5. A serial representation of A provided by encoder interface circuit 201 is received by a serial-in-parallel-out shift register 204. A serial representation of B is received by another serial-in-parallel-out shift register 205. Shift registers 204, 205 provide parallel representations of binary-weighted codes for A and B to an adder circuit for binary-weighted codes 206. Adder circuit 206 applies a parallel representation of D2 to a parallel bus 207 routed to receiving digital circuit 103.

In a second embodiment, decoder interface circuit 203 implements a limiting operation, and encoder interface circuit 201 implements a second algorithm described in this paragraph. Bits a(1), a(2), a(3), a(4), a(5), a(6), a(7), and a(8) assume the digital states of x(1), x(2), x(3), x(4), x(6), x(7), x(8), and x(9). Bits b(1)=b(2)=b(3)=b(5)=b(6)=b(7)=0. Bits b(4)=x(5) and b(8)=x(10). The second algorithm is also used in a third embodiment wherein a limiting operation is not desired, and a carry-out bit provided by adder circuit 206 is used to provide a 9$^{th}$ bit of a binary-weighted representation of D2 (not shown).

FIG. 6 shows a fourth embodiment, which is identical to the first embodiment except for a method of communicating redundant digital representation D3. In the fourth embodiment, encoder interface circuit 201 multiplexes (or interleaves) a serial representation of A with a serial representation of B on a single-lane serial interface A/B. Serial interface A/B is driven to voltage levels for bits a(n) representing A when a serial interface clock signal SCK transitions low-to-high. Serial interface A/B is driven to voltage levels for bits b(n) representing B when SCK transitions high-to-low. Serial-to-parallel shift register 204 reads serial interface A/B at rising edges of SCK to capture bits a(n). Serial-to-parallel shift register 205 reads serial interface A/B at falling edges of SCK to capture bits b(n). Accordingly, in the fourth embodiment, two bits of a composite code (A,B) of D3 are communicated via a serial interface with a single lane during a period of a clock signal. In the first embodiment, two bits of a composite code of D3 are communicated on a serial interface with two lanes during a period of a clock signal.

ADC circuit 101 may provide a digital representation D1 in a number system that during a conversion cycle provides states for progressively larger portions of a code of D1 that gradually narrows a range of numerical values that may be designated by the code. Accordingly, ADC circuit 101 may gradually narrow a numerical uncertainty range of D1. Many types of sequential ADCs gradually narrow a numerical uncertainty range during a conversion cycle, particularly including successive-approximation ADCs. Specifically, a SAR ADC may gradually narrow a numerical uncertainty range in substantially the same way as it does an analog-domain uncertainty range (described previously).

The present teaching defines an exemplary redundant number system D3=A+B, where A and B are represented by segments of a composite code which individually designate a numerical value. Redundancy of the defined number system for D3 allows several bits of the composite code to be communicated across a serial interface before an exact numerical value of D3 becomes known (i.e., before ADC circuit 101 has narrowed a numerical uncertainty range of D1 to include just one numerical value that can be designated by D3). Specifically, by selecting and transmitting individual bits of A and B during a conversion cycle, encoder interface circuit 201 gradually narrows a numerical uncertainty range for D3. More generally, encoder interface circuit 201 selects digital states for progressively larger portions of a code designating a value in a redundant number system selected for D3 such that (at each step of progression) a numerical uncertainty range for D3 is known to include all values in a numerical uncertainty range for D1. Accordingly, encoder interface circuit 201 may be designed to gradually narrow a numerical uncertainty range for D3 in response to a gradual narrowing of a numerical uncertainty range for D1. An encoder interface circuit that operates according to this principle may be characterized as being configured to use a numerical successive-approximation algorithm. Many types of circuits may be configured to use a numerical successive-approximation algorithm. For example, encoder interface circuit 201 may be implemented as a digital state machine.

A fifth embodiment is implemented according to FIG. 3. A sequential ADC circuit 101 provides a digital representation D1 based on composite codes each consisting of N codes x(1), x(2), x(3), ... x(N). The N codes are provided sequentially during an A/D conversion cycle comprising N steps. Each of the N codes comprises one or more bits allowing each code to designate one of P numerical weights (values). A numerical value designated by a composite code of digital representation D1 is defined as $W(x,1)+W(x,2)+W(x,3)+\ldots W(x,N)$ where W(x,n) represents a numerical weight designated by code x in step n of the conversion process. Specifically, in the fifth embodiment, ADC circuit 101 implements a 10-step (N=10) successive-approximation A/D conversion process using 10 single-bit (P=2) codes for digital representation D1. The numerical weights W(x,n) are nominally scaled to match a ratio of 1.9 to meet an objective of a digital overlap algorithm. ADC system 200 incorporates a digital correction algorithm, in that numerical weights W(x,n) may differ slightly from their nominal values (and may differ from one instance of ADC system 200 to another) to correct for mismatch of analog parameters in ADC circuit 101. FIG. 7a provides exemplary numerical weights W(x,n) that may be used for a particular instance of ADC system 200. The numerical weights W(x,n) may be fixed values stored in memory circuitry (programmed at production), or they may be obtained during operation of ADC system 200 (background calibration). Numerical weights W(x,n) of FIG. 7a correspond to values RL(n) and RU(n) of FIG. 7b defining numerical residue ranges for each step n of the conversion process. RL(n) designates a lower boundary and RU(n) an upper boundary for a residual numerical value that is represented by codes x(n+1), x(n+2), ... x(N). Specifically, in the fifth embodiment, RL(n) is defined as a sum of minimum numerical weights W(x,n) for each remaining step of the conversion process $RL(n)=W(0,n+1)+W(0,n+2)+. W(0,10)$. Likewise, RU(n) is defined as a sum of maximum numerical weights W(x,n) for each remaining step. In another embodiment, values RL(n) and RU(n) may be defined as fixed values that apply for all instances of ADC system 200 and selected such that each numerical residue range is sufficiently wide to enclose worst-case residual numerical values.

The fifth embodiment is similar to the first embodiment in that D1 is translated and truncated to a compact 8-bit straight binary-weighted digital representation D2. A numerical full-scale range of D2 is from 0 to 255/256. A limiting operation is implemented by encoder interface circuit 201. D3 is encoded as D3=A+B=D2, where A and B individually are represented by 8-bit straight binary-weighted codes. Timing diagram of FIG. 4 applies to the fifth embodiment, and decoder interface circuit 203 may be implemented as shown in FIG. 5.

Encoder interface circuit 201 is implemented as a digital state machine receiving digital codes x(n) sequentially during the conversion cycle and providing bits a(n), b(n) sequentially during a transmission period overlapping the conversion cycle. A software description of the digital state machine is provided in FIG. 8 using a notation that will execute with MATLAB software version 7.5.0 (software sold by "The Mathworks Inc."). An operation of the digital state machine depends on values provided in FIGS. 7a and 7b (included in the software description in a section labeled "numerical data"). A lower boundary of a numerical uncertainty range for D1 is calculated by accumulating weights W(x,n) for all known codes x(n) and then adding RL(n). A lower boundary of a numerical uncertainty range for D3 is calculated by assuming a minimum value (zero) for bits of codes for A and B that have not been assigned a value. A step of an encoding process is performed when a code x(n) is provided (starting with n=3), which narrows a numerical uncertainty range for D1 and allows for a narrowing of an uncertainty range for D3. In each step of the encoding process, bits a(n), b(n) of codes for A and B representing D3 are assigned a largest numerical value for which a lower boundary of the numerical uncertainty range for D3 does not exceed a lower boundary of the numerical uncertainty range of D1 (or an upper limit set at 255/256). Accordingly, the digital state machine is configured to use a numerical successive-approximation algorithm to derive a redundant digital representation D3. The software responds to a command "[A,B]=encoderinterfacecircuit([0 1 1 1 0 0 1 0 1 1])" with "A=[0 1 0 0 0 0 1]" and "B=[0 1 0 0 0 0 1 0]" which is defined to designate numerical values D3=A+B=67/256+66/256=133/256.

A transistor-level implementation of the digital state machine of encoder interface circuit 201 may be synthesized from a software-based description by someone who is ordinarily skilled in the art.

Numerous variations of the present teaching are envisioned, and the embodiments described herein are merely illustrations of exemplary embodiments. The appropriate choice of circuitry, numerical encoding schemes (compact as well as redundant), and algorithms may depend on the specific application and other factors such as the available types of semiconductors, capacitors, resistors, reliability voltage limits, silicon area, cost, and additional factors and considerations typically involved in the design of an integrated circuit. For example, encoder interface circuit may be implemented as a digital state machine in a CMOS technology, or using any other known circuit technique, method and process technology suitable for the implementation of such circuits. A digital state of a code may be represented by a single physical phenomenon (voltage, current, light intensity, frequency, phase, delay, temperature, etc.), and may be binary (a "bit") or multi-level. A resolution of a code (including codes comprising multi-level digital states) may be characterized by a number of bits calculated as a logarithm-base-2 of a number of permutations that the code may assume. A physical phenomenon used to represent digital states may be single-ended, differential, or multi-variable. A digital representation may be transferred from an encoder interface circuit to a decoder interface circuit via a serial interface with one or more data lanes. A serial interface may communicate information along any media suitable for transport of a physical phenomenon selected to represent digital states, including but not limited to voltage and current signals transported via a conductive media. A serial interface may provide galvanic isolation to limit interference, enhance safety, or to derive some other benefit. A serial interface may incorporate an explicit timing signal (e.g., a clock signal), or it may be self-timing with or without a dc-balancing function. Spectrum-spreading techniques may be used to reduce interference. A serial interface may be shared with other applications (including applications not performing A/D conversion), and several bit streams may be multiplexed in a single data stream. A serial interface may be bidirectional, and may be used to configure an ADC circuit and/or interface circuitry. Any known method to suppress or prevent bit errors may be incorporated, including but not limited to encoding using error correcting codes.

An exemplary redundant digital representation has been described herein to illustrate that a decoder interface circuit may be generic and of low complexity. Many other redundant digital representations may be defined and used to implement the present teaching, including digital representations that may or may not be symmetrical (A and B need not be interchangeable, e.g., A may have a higher resolution than B) or construed as being composed of distinct code segments (A and B). A redundant digital representation may be selected to optimize a specific parameter, e.g., reduce a bit rate of a serial interface. A numerical value of redundant digital representation D3 may be obtained by combining a numerical value of a first code (A) and a numerical value of a second code (B) using addition. It will be recognized that an operation involving adding numerical values designated by two codes is equivalent to an operation involving subtracting the numerical values, because an equivalent operation can be achieved by applying a definition of a number system. Accordingly, the exemplary redundant digital representation D3=A+B is equivalent to redundant digital representations D3=A−B, D3=B−A, and D3=−A−B.

An ADC system implemented according to the present teaching may provide a compact digital representation of any resolution, including representations of relatively high resolution (e.g., 16, 18, or 20 bits). A digital representation of a numerical value provided by a decoder interface circuit to a receiving digital circuit need not be compact. While it may be advantageous for an ADC system to provide a compact digital representation, it will be recognized that an ADC system according to the present teaching may be configured to provide any digital representation deemed suitable for an application. An ADC circuit may evaluate a single-ended, differential, or pseudo-differential analog quantity, and it may be configured to provide a digital representation of a function of an analog input signal (e.g. a time-derivative, coefficients for a discrete Fourier transformation, correlation parameters, etc.). An ADC circuit may incorporate fully-differential circuitry, single-ended circuitry, or a combination thereof. Circuits implemented according to this present teaching may incorporate a plurality of types of semiconductor devices (including all flavors of MOS, BJT, IGBT, IGFET, JFET, FINFET, organic transistors, nano-carbon-tube devices etc.), some of which may be selected to withstand high voltages, and others which may be selected for fast settling of low-voltage circuit nodes. Circuits may be implemented using a technology that provides asymmetrical devices (BCD etc.) in addition to symmetrical MOS devices, and the technology may incorporate oxides and other physical structures having a plurality of dimensions and electrical properties. The present teaching may incorporate an ADC circuit configured to implement any sequential A/D conversion process, including configurations wherein a result is derived from partial results obtained from several A/D conversions. A filtering process, including a multi-rate filtering process, may be used to combine results from several A/D conversions. An A/D conversion process/circuit used in combination with this present teaching may incorporate several algorithms and/or circuit techniques, including but not limited to digital overlap, digital calibration/correction (static or adaptive, operating in the background, foreground, in-loop or out-of-loop), compensation, bootstrapping, gain-boosting oversampling, mismatch-shaping, averaging, filtering, application of dither (additive and/or transparent), and/or any other known method to overcome imperfections of a data converter circuit and/or to improve its performance. This present teaching may be incorporated as a subsystem in a larger ADC system and/or integrated-circuit systems of a higher degree of functional complexity, such as industrial control systems, medical applications (e.g., x-ray and MRI machines), consumer application (e.g., games and television), etc. An ADC system according to the present teaching may interface several distinct analog signals and an encoder interface circuit may simultaneously encode digital representations of several numerical values and communicate them with reduced latency across an interface with one or more data lanes.

Accordingly, while particular embodiments of the present teaching have been shown and described, it will be obvious to those skilled in the art that changes and modifications may be made without departing from this present teaching in its broader aspects and, therefore, the appended claims are to encompass within their scope all such changes and modifications that are within the true spirit and scope of this present teaching.

What is claimed is:

1. An analog-to-digital converter system, comprising:
an analog-to-digital converter circuit configured to provide sequentially a plurality of codes during a conversion period;
an encoder interface circuit configured to receive the plurality of codes and to derive a redundant digital representation;
the encoder interface circuit being further configured to transmit a portion of the redundant digital representation during the conversion period; and wherein the encoder interface circuit is configured to narrow a numerical uncertainty range of the redundant digital representation in response to the analog-to-digital converter circuit providing a code in the plurality of codes.

2. The analog-to-digital converter system of claim 1 wherein the encoder interface circuit is configured to derive the redundant digital representation using a numerical successive-approximation algorithm.

3. The analog-to-digital converter system of claim 1, wherein the encoder interface circuit comprises a digital state machine configured to be clocked in response to the analog-to-digital converter circuit providing a code in the plurality of codes.

4. The analog-to-digital converter system of claim 1, wherein the redundant digital representation comprises:
a first code representing a first numerical value;
a second code representing a second numerical value;
where the first and second codes are distinct segments of a composite code designating a numerical value.

5. The analog-to-digital converter system of claim 4 wherein the first numerical value and the second numerical value are combined using addition to calculate the numerical value designated by the composite code.

6. The analog-to-digital converter system of claim 4 wherein the first and second codes are binary-weighted representations of the first and second numerical values.

7. The analog-to-digital converter system of claim 1 wherein the encoder interface circuit is configured to implement a limiting operation.

8. The analog-to-digital converter system of claim 1, wherein the encoder interface circuit is configured to transmit a group of at least two bits of the redundant digital representation during a period of a clock signal.

9. The analog-to-digital converter system of claim 8, wherein the encoder interface circuit is configured to transmit a first bit at a rising edge of the clock signal and a second bit at a falling edge of the clock signal.

10. The analog-to-digital converter system of claim 1, wherein the encoder interface circuit is configured to transmit the redundant digital representation during a transmission period, where at least a half of the transmission period overlaps the conversion period.

11. The analog-to-digital converter system of claim 1 wherein the analog-to-digital converter circuit is configured to operate with a successive-approximation algorithm.

12. An analog-to-digital converter system, comprising:
an analog-to-digital converter circuit configured to provide sequentially a plurality of codes during a conversion period;
an encoder interface circuit configured to receive the plurality of codes and to derive a redundant digital representation;
the encoder interface circuit being further configured to transmit a portion of the redundant digital representation during the conversion period; and
wherein the analog-to-digital converter circuit is configured to operate with a digital overlap algorithm.

13. The analog-to-digital converter system of claim 1, wherein the analog-to-digital converter circuit is configured to operate with a digital correction algorithm.

14. The analog-to-digital converter system of claim 1, wherein the plurality of codes consists of a first number of codes provided sequentially by the analog-to-digital converter circuit, and wherein a code of the redundant digital representation comprises a second number of bits, where the second number is greater than the first number.

15. A method for encoding and transmitting a first numerical value obtained from a sequential analog-to-digital conversion process implemented by an analog-to-digital converter circuit, comprising the steps of:
receiving a first set of codes that are defined for a first number systems; the first set of codes confining the first numerical value to be enclosed by a first numerical uncertainty range;
providing a second number system, different from the first number system, using codes to designate numerical values;
assigning a digital state to a portion of a code defined for the second number system to define a second numerical uncertainty range enclosing the first numerical uncertainty range; and
transmitting a signal representing the assigned digital state of the portion of the code defined for the second number system before the analog-to-digital conversion process completes.

16. The method of claim 15 further comprising the step of:
implementing a numerical successive-approximation algorithm to define the second numerical uncertainty range enclosing the first numerical uncertainty range.

17. The method of claim 15 further comprising the steps of:
using a first segment of a code defined for the second number system to define a first-segment numerical value;
using a second segment of the code defined for the second number system to define a second-segment numerical value;
combining the first-segment numerical value and the second-segment numerical value using addition.

18. The method of claim 17 wherein the first segment and the second segment of the code defined for the second number system are interchangeable.

19. The method of claim 15 further comprising the step of:
implementing a digital correction algorithm in the analog-to-digital conversion process.

* * * * *